United States Patent
Jeong et al.

(10) Patent No.: US 11,756,578 B2
(45) Date of Patent: Sep. 12, 2023

(54) FERRIMAGNETIC HEUSLER COMPOUNDS WITH HIGH SPIN POLARIZATION

(71) Applicants: Samsung Electronics Co., Ltd., Gyeonggi-do (KR); INTERNATIONAL BUSINESS MACHINES CORPORATION, Armonk, NY (US)

(72) Inventors: Jaewoo Jeong, San Jose, CA (US); Sergey Faleev, San Jose, CA (US); Panagiotis Charilaos Filippou, San Jose, CA (US); Yari Ferrante, San Jose, CA (US); Stuart Stephen Papworth Parkin, San Jose, CA (US); Mahesh Samant, San Jose, CA (US)

(73) Assignee: Samsung Electronics Co., Ltd., Yongin-si (KR)

( * ) Notice: Subject to any disclaimer, the term of this patent is extended or adjusted under 35 U.S.C. 154(b) by 51 days.

(21) Appl. No.: 17/318,998

(22) Filed: May 12, 2021

(65) Prior Publication Data
US 2022/0262555 A1 Aug. 18, 2022

Related U.S. Application Data

(60) Provisional application No. 63/150,036, filed on Feb. 16, 2021.

(51) Int. Cl.
*G11B 5/39* (2006.01)
*G11C 11/16* (2006.01)
(Continued)

(52) U.S. Cl.
CPC .......... *G11B 5/3909* (2013.01); *G11C 11/161* (2013.01); *G11C 11/1675* (2013.01);
(Continued)

(58) Field of Classification Search
None
See application file for complete search history.

(56) References Cited

U.S. PATENT DOCUMENTS

| | | | |
|---|---|---|---|
| 8,717,715 B1 * | 5/2014 | Sato | G01R 33/1284 360/324 |
| 8,810,973 B2 * | 8/2014 | Gill | G11B 5/3909 360/324.11 |

(Continued)

*Primary Examiner* — Craig A. Renner
(74) *Attorney, Agent, or Firm* — Lewis Roca Rothgerber Christie LLP (57) ABSTRACT

A magnetic device and method for providing the magnetic device are disclosed. The magnetic device includes a multilayer structure and a magnetic layer. The multilayer structure includes alternating layers of A and E. A includes a first material. The first material includes at least one of Co, Ru, or Ir. The first material may include an IrCo alloy. E includes at least one other material that includes Al. The other material(s) may include an alloy selected from AlGa, AlSn, AlGe, AlGaGe, AlGaSn, AlGeSn, and AlGaGeSn. A composition of the multilayer structure is represented by $A_{1-x}E_x$, where x is at least 0.45 and not more than 0.55. The magnetic layer includes an Al-doped Heusler compound. The magnetic layer shares an interface with the multilayer structure.

20 Claims, 5 Drawing Sheets

(51) Int. Cl.
*G11C 19/08* (2006.01)
*H01F 1/03* (2006.01)
*H01F 10/193* (2006.01)
*H01F 10/30* (2006.01)
*H01F 10/32* (2006.01)
*H01F 41/30* (2006.01)
*H10N 50/85* (2023.01)
*H10N 50/10* (2023.01)
*H10N 50/01* (2023.01)

(52) U.S. Cl.
CPC ............... *G11C 19/08* (2013.01); *H01F 1/03* (2013.01); *H01F 10/1936* (2013.01); *H01F 10/30* (2013.01); *H01F 10/324* (2013.01); *H01F 41/302* (2013.01); *H10N 50/01* (2023.02); *H10N 50/10* (2023.02); *H10N 50/85* (2023.02); *H01F 10/3272* (2013.01); *H01F 10/3286* (2013.01)

(56) References Cited

U.S. PATENT DOCUMENTS

| | | | |
|---|---|---|---|
| 9,034,662 B2 * | 5/2015 | Zhang | H01L 29/66984 257/425 |
| 9,643,385 B1 * | 5/2017 | Butler | H01F 10/14 |
| 2007/0109693 A1 * | 5/2007 | Carey | B82Y 10/00 |
| 2007/0297103 A1 * | 12/2007 | Zhang | H01F 41/183 360/324.12 |
| 2019/0035849 A1 * | 1/2019 | Jeong | C22C 22/00 |
| 2020/0243755 A1 * | 7/2020 | Jeong | H01F 10/3286 |
| 2020/0259076 A1 * | 8/2020 | Filippou | H01F 10/3272 |
| 2022/0165469 A1 * | 5/2022 | Jeong | H01F 10/3254 |
| 2022/0165938 A1 * | 5/2022 | Jeong | H01L 43/02 |
| 2022/0165939 A1 * | 5/2022 | Jeong et al. | H01F 10/3254 |

* cited by examiner

FERRIMAGNETIC HEUSLER COMPOUNDS WITH HIGH SPIN POLARIZATION

CROSS REFERENCE TO OTHER APPLICATIONS

This application claims priority to U.S. Provisional Patent Application No. 63/150,036 entitled FERRIMAGNETIC HEUSLER COMPOUND WITH HIGH SPIN POLARIZATION filed Feb. 16, 2021 which is incorporated herein by reference for all purposes.

TECHNICAL FIELD

The present application is related to magnetic devices, such as magnetic memories that utilize spin transfer torque, racetrack memories and hard disk storage.

BACKGROUND OF THE INVENTION

Magnetic memories such as magnetic random access memories (MRAMs) store information utilizing magnetic materials as an information storage medium. For example, a magnetic tunneling junction (MTJ) may be used in an MRAM, such as a spin transfer torque MRAM (STT-MRAM). The MTJ typically includes a reference (or pinned) layer, a free (or storage) layer and a tunneling barrier layer between the reference and free layers. The reference and free layers are magnetic. The magnetic moment of the reference layer is generally fixed, or pinned, in a particular direction. The free layer has a changeable magnetic moment and is used to store information. A bottom contact below the MTJ and a top contact on the MTJ are used to drive current through the MTJ in a current-perpendicular-to-plane (CPP) direction in an STT-MRAM. In the case of MTJs with positive tunnel magnetoresistance (TMR), when a sufficient current is driven in one direction perpendicular-to-plane (e.g. top to bottom), the free layer magnetic moment switches to be parallel to that of the reference layer. When a sufficient current is driven in the opposite direction (e.g. bottom to top), the free layer magnetic moment switches to be antiparallel to that of the reference layer. Different magnetic configurations correspond to different magnetoresistances and thus different logical states (e.g. a logical "0" and a logical "1") of the MTJ.

Because of their potential for use in a variety of applications, research in magnetic memories is ongoing. Accordingly, what is needed is a method and system that may improve the performance of magnetic junctions.

BRIEF DESCRIPTION OF THE DRAWINGS

Various embodiments of the invention are disclosed in the following detailed description and the accompanying drawings.

SUMMARY

A magnetic device and method for making the magnetic device are described. The magnetic device includes a multilayer structure and a magnetic layer that shares an interface with the multilayer structure. The multilayer structure includes alternating layers of A and E. A composition of the multilayer structure may be represented by $A_{1-x}E_x$, where x is at least 0.45 and not more than 0.55. A may include at least one of Co, Ru, or Ir. For example, A may include an IrCo alloy. E includes at least one other material that includes Al. For example, E may include an alloy selected from AlGa, AlSn, AlGe, AlGaGe, AlGaSn, AlGeSn, and/or AlGaGeSn. The magnetic layer includes an Al-doped Heusler compound. Al-doped Heusler compound may also be ferrimagnetic. The Al-doped Heusler compound may be represented by $Al_wH$, where H is a Heusler compound of the Al-doped Heusler compound and w is greater than zero and not more than one. The Heusler compound (H) may include at least one of $Mn_{3.3-z}Ge$, $Mn_{3.3-z}Sn$, or $Mn_{3.3-y}Sb$, where z is at least 0 and not more than 0.8 and where y is at least 0 and not more than 1.3. In some embodiments, the magnetic device also includes a layer that underlies the multilayer structure. The layer includes at least one of a $Mn_yN$ layer or a $V_zN$ layer, where y is at least two and not more than five and z is at least 0.7 and not more than 1.3. In some embodiments, the magnetic device is a magnetic tunneling junction that also includes a tunnel barrier and an additional magnetic layer in contact with the tunnel barrier.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

The exemplary embodiments are described in the context of particular methods, layers, devices, magnetic junctions and magnetic memories having certain components. One of ordinary skill in the art will readily recognize that the present invention is consistent with the use of devices, magnetic junctions and magnetic memories having other and/or additional components and/or other features not inconsistent with the present invention. The method and system are also described in the context of current understanding of various physical phenomena. Consequently, one of ordinary skill in the art will readily recognize that theoretical explanations of the behavior of the method and system are made based upon this current understanding of these physical phenomena. However, the method and system described herein are not dependent upon a particular physical explanation. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the method and system are described in the context of magnetic junctions and/or substructures having particular layers. However, one of ordinary skill in the art will readily recognize that magnetic junctions and/or substructures having additional and/or different layers not inconsistent with the method and system could also be used. Moreover, certain components are described as being magnetic, ferromagnetic, and ferrimagnetic. As used herein, the term magnetic could include ferromagnetic, ferrimagnetic and/or like structures. As used herein, "in-plane" is substantially within or parallel to the plane of one or more of the layers of a magnetic junction. Conversely, "perpendicular" and "perpendicular-to-plane" corresponds to a direction that is substantially perpendicular to one or more of the layers of the magnetic junction. The method and system are also described in the context of certain alloys. Unless otherwise specified, if specific concentrations of the alloy are not mentioned, any stoichiometry not inconsistent with the method and system may be used.

In a conventional magnetic random access memory (MRAM), the basic storage element is a magnetic junction, which includes two magnetic layers separated by a nonmagnetic spacer layer. Frequently, a magnetic tunnel junction (MTJ) is used in MRAM. An MTJ includes an ultra-thin insulating layer referred to as a "tunnel barrier" as (or in) the nonmagnetic spacer layer. The resistance of the MTJ device depends on the relative orientation of the magnetization of the two magnetic layers. The magnetization of the free layer (also termed the storage or memory layer) is toggled between being parallel or anti-parallel to the magnetization of the reference magnetic layer (also termed a pinned layer). In some cases, the change in magnetic state of the MTJ device is achieved via spin transfer torque (STT) effect by passing an electric current through the device.

In current MRAM, the magnetic layers of the MTJ include ferromagnetic alloys of Co, Fe, and B (termed "CoFeB" herein, without requiring a specific stoichiometry). The magnetic layers may be configured with their magnetic moments aligned (i.e. stable at a room temperature of approximately twenty-five degrees Celsius) perpendicular to the layer ("perpendicular-to-plane"). For magnetic layers having a perpendicular-to-plane magnetic moment or a high perpendicular magnetic anisotropy (PMA), the PMA energy of the magnetic layer exceeds the out-of-plane demagnetization energy. The perpendicular alignment of magnetization of a CoFeB alloy arises from interfacial effects. For example, the PMA of a CoFeB layer may arise from the interfaces between the CoFeB layer and the tunneling barrier layer and/or the underlayer on which the CoFeB layer is deposited. These interfacial effects are typically weak. Consequently, current MRAM devices may be limited to sizes (lateral, in-plane dimensions) of greater than or equal to twenty nm. It is desirable to find alternate magnetic materials for use within MTJs which have a perpendicular magnetic anisotropy (PMA) energy that exceeds the out-of-plane demagnetization energy at smaller lateral sizes.

In addition to a large PMA, magnetic layers are also desired to have a low magnetic moment for use in MRAM. A low magnetic moment allows for a lower switching current and a narrow switching pulse width (e.g. twenty nanoseconds and/or less). Consequently, a mechanism for decreasing the switching current of magnetic junctions while maintaining their PMA at smaller sizes is desirable.

Heusler compounds are a promising candidate material for scaling of MRAM devices below twenty nanometers. Heusler compounds have the chemical formula $X_2YZ$, where X and Y atoms are transition metals or lanthanides and Z atom is a main group element. Heusler compounds take up two different structures depending on the location of X and Y atoms in the unit cell. In a 'regular' Heusler compound the X atoms occupy two sites tetrahedrally coordinated (T) by the Z atom, and the Y atom is octahedrally-coordinated (O) by Z atoms. In an 'inverse' Heusler compound one of the X atoms is interchanged with Y atoms so that there is one X atom in a T site and one in an O site. When X and Y atoms are magnetic 3d transition metals the Heusler compounds can display magnetic ground states which can either be ferro-magnetic (FM) or ferri-magnetic (FiM). The magnetic moment per unit cell can be tuned by varying X and Y atoms, and can even be tuned to zero for fully compensated Heusler compounds. Some Heusler compounds have a tetragonal structure such that thin films may exhibit perpendicular magnetic anisotropy along their tetragonal axis at room temperature (RT). Magnetic materials showing intrinsic PMA and low magnetic moment are desirable for deeply scaled spin transfer torque magnetic random access memory (STT-MRAM) applications (e.g. for lateral dimensions of less than twenty nanometers). The use of these Heusler compounds in perpendicular MTJ devices could allow for increased memory storage and reduced switching current densities, whilst preserving sufficient stability against thermal perturbations.

One magnetic material among the family of tetragonal Heusler compounds is the FiM $Mn_3Ge$ Heusler compound. A FiM $Mn_3Ge$ Heusler compound has a crystal structure of alternating Mn—Mn and Mn—Ge layers (i.e. Mn—Mn layer/Mn—Ge layer/Mn—Mn layer etc.) having opposite magnetizations. Other examples of such tetragonal Heusler compounds are binary compounds (e.g., $Mn_3Z$, where Z=Ga, Sn, or Sb) and ternary compounds (e.g., $Mn_2CuSb$, $Mn_2CoSn$, $Mn_2OsSn$, etc.). Although these Heusler compounds may have a low magnetic moment and high PMA, the tunneling magnetoresistance (TMR) of MTJ devices including magnetic layers of $Mn_3Ge$ and CoFeB and with MgO as tunnel barrier is small. This is true despite the reputation of MgO as providing a high TMR for CoFeB magnetic layers. Therefore, such Heusler compounds may be inappropriate for use in magnetic devices, such as MTJs. Thus, a mechanism for providing MTJs having higher TMR with magnetic layers having high PMA (e.g. perpendicular-to-plane magnetic moments), lower switching current and faster switching is still desired.

A magnetic device is disclosed. The magnetic device includes a multilayer structure and a magnetic layer. The multilayer structure includes alternating layers of A and E. A includes a first material. The first material includes at least one of Co, Ru, or Ir. The first material may include an IrCo alloy. E includes at least one other material that includes Al. The other material(s) may include an alloy selected from AlGa, AlSn, AlGe, AlGaGe, AlGaSn, AlGeSn, and AlGaGeSn. A composition of the multilayer structure is represented by $A_{1-x}E_x$, where x is at least 0.45 and not more than 0.55. The magnetic layer includes an Al-doped Heusler compound. The magnetic layer shares an interface with the multilayer structure.

In some embodiments, the Al-doped Heusler compound is represented by $H_{1-y}Al_y$, where H is an undoped Heusler compound of the Al-doped Heusler compound, $H_{1-y}$ is the Heusler compound having a species (such as the main group element) reduced by y and y is greater than zero and not more than one. For example, if H is $Mn_3Z$, where Z is Ge, Sn, or Sb, then $H_{1-y}$ may be $Mn_3Z_{1-y}$. In some embodiments, a magnetic moment of the magnetic layer is substantially perpendicular to the interface. The magnetic layer may have a thickness of not more than 5 nm. In some embodiments, a Heusler compound of the Al-doped Heusler compound is a binary Heusler compound. The Heusler compound, H, may include at least one of $Mn_{3.3-z}Ge$, $Mn_{3.3-z}Sn$, or $Mn_{3.3-y}Sb$, where z is at least 0 and not more than 0.8 and where y is at least 0 and not more than 1.3.

In some embodiments, the magnetic device also includes a layer that underlies the multilayer structure. The layer includes at least one of a $Mn_yN$ layer or a $V_zN$ layer, where y is at least two and not more than five and z is at least 0.7 and not more than 1.3. In some embodiments, the device includes a tunnel barrier and an additional magnetic layer in contact with the tunnel barrier. The tunnel barrier is between the magnetic layer and the additional magnetic layer. The tunnel barrier is selected from MgO or $Mg_{1-z}Al_{2+(2/3)z}O_4$, wherein $-0.5<z<0.5$ in some embodiments.

A device includes magnetic junctions and conductive lines coupled with the magnetic junctions. Each of the magnetic junctions includes a multilayer structure, a magnetic layer, an additional magnetic layer, and tunnel barrier between the magnetic layer and the additional magnetic layer. The multilayer structure includes alternating layers of A and E. A includes a first material. E includes at least one other material that includes Al. The first material includes at least one of Co, Ru, or Ir. A composition of the multilayer structure is represented by $A_{1-x}E_x$, where x is at least 0.45 and not more than 0.55. The magnetic layer includes an Al-doped Heusler compound. The magnetic layer shares an interface with the multilayer structure. The additional magnetic layer is in contact with the tunnel barrier.

In some embodiments, the Al-doped Heusler compound is represented by $H_{1-y}Al_y$ where H is an undoped Heusler compound of the Al-doped Heusler compound, $H_{1-y}$ is the undoped Heusler compound having a species (such as the main group element) reduced by a factor of 1-y, and y is greater than zero and not more than one. For example, if H is $Mn_3Z$, where Z is Ge, Sn, or Sb, then $H_{1-y}$ may be $Mn_3Z_{1-y}$. In some embodiments, a Heusler compound of the Al-doped Heusler compound includes Mn and an element selected from the group consisting of Sn, Sb, or Ge. $Mn_{3.3-z}Ge$, $Mn_{3.3-z}Sn$, or $Mn_{3.3-y}Sb$, where z is at least 0 and not more than 0.8 and where y is at least 0 and not more than 1.3. Each of the magnetic junctions may further include a layer underlying the multilayer structure. The layer includes at least one of a $Mn_yN$ layer or a $V_zN$ layer, where y is at least two and not more than five and z is at least 0.7 and not more than 1.3. The device may be a racetrack memory device.

A method includes providing a multilayer structure. The multilayer structure has alternating layers of A and E. A includes a first material. E includes at least one other material that includes Al. The first material includes at least one of Co, Ru, or Ir. A composition of the multilayer structure is represented by $A_{1-x}E_x$, where x is at least 0.45 and not more than 0.55. The method also includes providing a magnetic layer on the multilayer structure. The magnetic layer includes an Al-doped Heusler compound. The magnetic layer shares an interface with the multilayer structure.

The method may also include providing a layer including at least one of a $Mn_yN$ layer or a $V_zN$ layer, where y is at least two and not more than five and z is at least 0.7 and not more than 1.3. The layer underlies the multilayer structure. In some embodiments, the method includes providing a tunnel barrier. The method includes providing an additional magnetic layer in contact with the tunnel barrier. The tunnel barrier being between the magnetic layer and the additional magnetic layer.

Such magnetic device(s) and method(s) described herein may be used in MTJs which have a higher TMR, a lower magnetic moment (e.g. for FiM Heusler compounds) and/or magnetic moments that are stable perpendicular-to-plane. Thus, MTJs using the magnetic device(s) and fabricated using the method(s) may be scaled to smaller sizes, may be switched using lower write currents and/or may exhibit faster switching. Consequently, performance of MTJs and/or other magnetic devices may be improved.

Figure 1A:
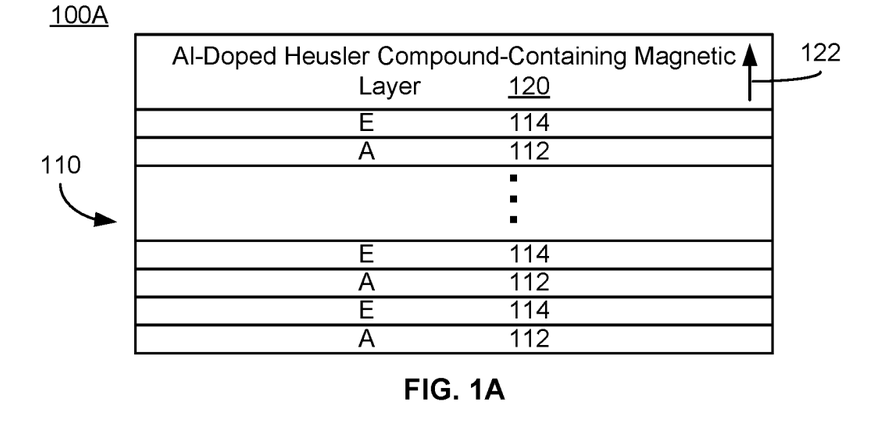
FIGS. 1A-1C depict embodiments of magnetic devices including Al-doped Heusler compounds and that may be usable in magnetic devices such as magnetic junctions.
Figure 1B:
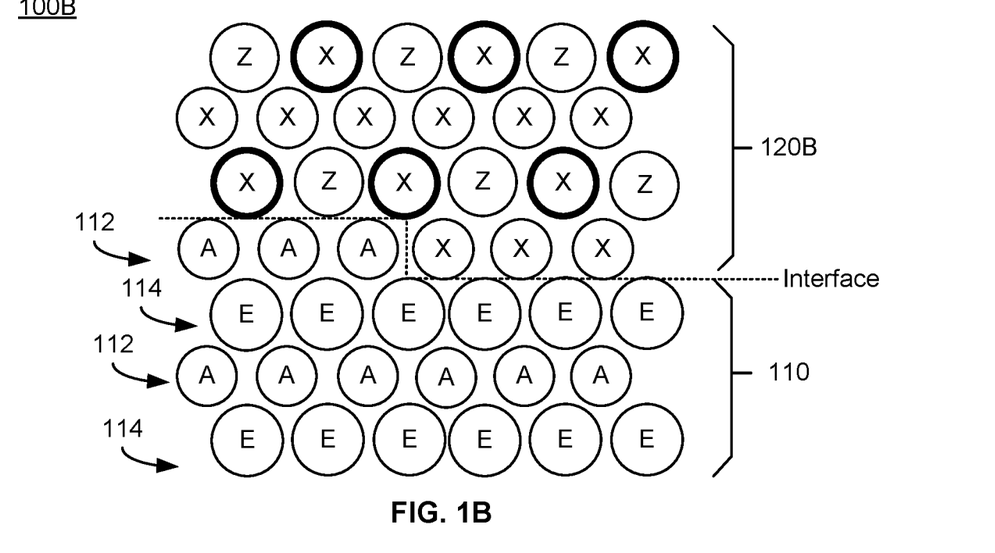
Figure 1C:
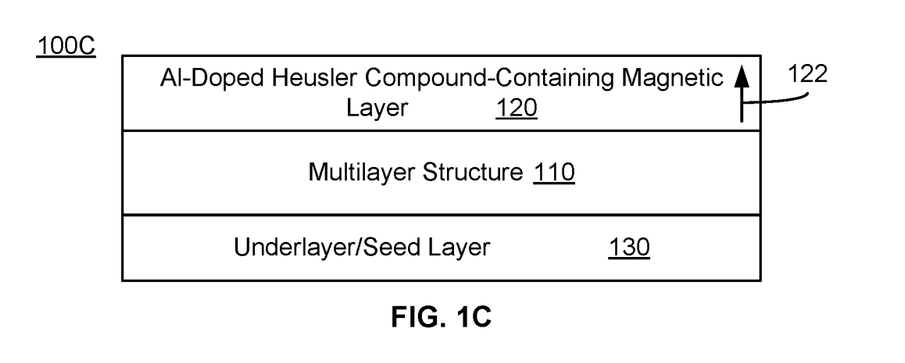

FIGS. 1A-1C depict embodiments of magnetic devices 100A, 100B, and 100C including Heusler compounds and that may be usable in magnetic devices such as magnetic junctions. FIGS. 1A-1C are not to scale and additional layers (not shown) may be present in some embodiments. The magnetic structure(s) 100A, 100B, and/or 100C may be used in a variety of magnetic devices and, therefore, a variety of electronic devices. For example, magnetic structure 100A, 100B, and/or 100C may be used in a magnetic junction such as a MTJ that may be included in a MRAM such as an STT-MRAM or in a racetrack memory.

Referring to FIG. 1A, magnetic structure 100A includes multilayer structure 110 and magnetic layer 120. Magnetic layer 120 includes an Al-doped Heusler compound having a high perpendicular magnetic anisotropy (PMA). Thus, the composition of the Al-doped Heusler compound of magnetic layer 120 may take the form $H_{1-w}Al_w$, where $0<w\leq 1$, H is an undoped Heusler compound, and $H_{1-w}$ is the undoped Heusler compound having a constituent (e.g. the main group element) reduced by 1-w. For example, if H is $Mn_3Z$, where Z is Ge, Sn, or Sb, then $H_{1-w}$ may be $Mn_3Z_{1-w}$. In some embodiments, magnetic layer 120 includes only Al-doped Heusler compound(s). For example, magnetic layer 120 may be a layer consisting of an Al-doped Heusler compound. In other embodiments, magnetic layer 120 may be a multilayer including one or more Al-doped Heusler compounds and/or other materials (including but not limited to other Heusler compounds). Magnetic layer 120, and the Al-doped Heusler compound(s) therein, each has a PMA energy that exceeds the out-of-plane demagnetization energy. Thus, magnetic moment 122 of magnetic layer 120 has stable states perpendicular-to-plane (i.e. perpendicular to the interface between magnetic layer 120 and multilayer structure 110). For example, the magnetic moment 122 may be stable perpendicular-to-plane at room temperature (e.g. twenty-five degrees Celsius). One such stable state is shown in FIG. 1A.

In some embodiments, the Heusler compound (H in the $H_{1-w}Al_w$ example above) of the Al-doped Heusler compound is a binary Heusler compound. In some embodiments, the Heusler compound(s) of magnetic layer 120 includes or consists of particular Mn-based Heusler compounds. For example, the Heusler compound(s) used may include or be composed of one or more of $Mn_{3.3-z}Ge$, $Mn_{3.3-z}Sn$, or $Mn_{3.3-y}Sb$, where z is at least 0 and not more than 0.8 and where y is at least 0 and not more than 1.3. For example, the magnetic layer may include or consist of Al-doped $Mn_3Ge$ (e.g. $Mn_3Ge_{1-y}Al_y$), Al-doped $Mn_3Ga$ (e.g. $Mn_3Ga_{1-y}Al_y$), $Mn_3Sn$ (e.g. $Mn_3Sn_{1-y}Al_y$), and/or Al-doped $Mn_3Sb$ (e.g. $Mn_3Sb_{1-y}Al_y$). Magnetic layer 120 may have a thickness of up to 100 nanometers. In some embodiments, magnetic layer 120 has a thickness of not more than fifty nanometers. In some embodiments, magnetic layer has a thickness of not more than ten nanometers. Magnetic layer 120 may have a thickness of not more than five nanometers. In some embodiments, the thickness of magnetic layer 120 (and/or the Al-doped Heusler compound) is not more than three nanometers. The Al-doped Heusler compound and/or magnetic layer 120 may also be at least 0.8 nanometers thick. In some embodiments, magnetic layer 120 and/or Al-doped Heusler compound are at least three nanometers thick. However, other thicknesses may be used.

Multilayer structure 110 is a templating structure is used to template magnetic layer 120 and may be nonmagnetic at room temperature (e.g. nonmagnetic at least at twenty-five degrees Celsius and below). Multilayer structure 110 is configured to have the appropriate structure (e.g. lattice constant, symmetry and/or texture) for growing or otherwise providing one or more layers of magnetic layer 120 on multilayer structure 110. In the embodiment shown, magnetic layer 120 (e.g. the Al-doped Heusler compound) shares an interface with multilayer structure 110. In some embodiments, multilayer structure 110 templates the Al-doped Heusler compound of magnetic layer 120. Thus, multilayer structure 110 is configured to have the appropriate structure (e.g. lattice constant, symmetry and/or texture) for growing or otherwise providing the Al-doped Heusler compound. For example, multilayer structure 110 may have a (001) texture and a small lattice mismatch (e.g. not more than ten percent in some embodiments and not more than five percent in some such embodiments) with magnetic layer 120 and/or the Al-doped Heusler compound(s) used therein.

Multilayer structure 110 includes alternating layers 112 and 114 of A and E, respectively. A of layer 112 includes a first material that has at least one of Co, Ru, or Ir therein. In some embodiments, A consists of the first material. For example, the first material may include an IrCo alloy. In some embodiments, A consists of the IrCo alloy. Thus, layer 112 may consist of the IrCo alloy. E of layer 114 includes at least one other material that includes Al. In some embodiments, E consists of the other material(s) that include Al. In some embodiments, E includes an alloy of Al. The other material(s) of E may include one or more alloy(s) selected from AlGa, AlSn, AlGe, AlGaGe, AlGaSn, AlGeSn, or AlGaGeSn. For example, layer 114 may consist of one or more of AlGa, AlSn, AlGe, AlGaGe, AlGaSn, AlGeSn, or AlGaGeSn. The composition of the multilayer structure is represented by $A_{1-x}E_x$, where x is at least 0.45 and not more than 0.55. In the Co and IrCo examples above, the multilayer structure may be $Co_{1-x}E_x$ or $(CoIr)_{1-x}E_x$. In some embodiments, where A includes Ir or Ru and E includes Al, the multilayer structure may be represented by $A_{1-x}E_x$, where x is at least 0.47 and not more than 0.54.

In some embodiments, multilayer structure 110 is at least five Angstroms and not more than one thousand Angstroms thick. Multilayer structure 110 may be not more than six hundred Angstroms thick. In some embodiments, multilayer structure 110 is not more than three hundred Angstroms thick. In some such embodiments, multilayer structure 110 may be not more than ten Angstroms thick.

Although layer 114 of E is shown as the layer sharing an interface with magnetic layer 120, in some embodiments, layer 112 of A and/or layer 114 of E may share an interface with magnetic layer 120. For example, FIG. 1B depicts a portion of magnetic structure 100B that is analogous to magnetic structure 100A. Magnetic structure 100B thus includes multilayer structure 110 and magnetic layer 120B that are analogous to multilayer structure 110 and magnetic layer 120 depicted in FIG. 1A. Magnetic layer 120B is a binary Al-doped Heusler layer of the form $X_3Z$, where X may be a material such as Mn and Z may be Ge, Sn or Sb in the embodiment shown. Other Al-doped Heusler compound(s) are possible. Multilayer structure 110 includes layers 112 and 114 of A and E, respectively. In the embodiment shown, A may be Co and E may be Al. In FIG. 1B, therefore, A and X can be considered to represent transition metal elements, while E and Z can be considered to represent main group elements. As can be seen in FIG. 1B, the interface (shown by a dotted line) has an atomic step therein. Thus, layer 112 of A shares the interface with a portion magnetic layer 120B, while layer 114 of E shares the interface with another portion of magnetic layer 120B.

FIG. 1C depicts magnetic structure 100C, which is analogous to magnetic structures 100A and/or 100B. Magnetic structure 100C thus includes multilayer structure 110 and magnetic layer 120 that are analogous to multilayer structure 110 and magnetic layer(s) 120 and/or 120B depicted in FIGS. 1A-1B.

Also shown in FIG. 1C is layer 130. Layer 130 may be considered an underlayer or seed layer used in conjunction with multilayer structure 110. Thus, multilayer structure 110 resides on and is in physical contact with (e.g. shares an interface with) layer 130. Layer 130 may include or consist of a $Mn_xN$ seed layer and/or a $V_zN$ seed layer (e.g. where x is at least 2 or 2.5 and not more than 4.75 or 5 and z is at least 0.7 and not more than 1.3). Such a layer 130 may be not more than one hundred nanometers thick. In some embodiments, layer 130 is not more than fifty nanometers thick. In some embodiments, layer 130 is at least five nanometers and not more than thirty nanometers thick.

Performance of magnetic devices may be improved using one or more of magnetic structures 100A, 100B and/or 100C. In some embodiments, magnetic layer 120/120B and/or the Al-doped Heusler compound therein has a magnetic moment 122 that is stable perpendicular-to-plane (e.g. stable at least at room temperature of twenty-five degrees Celsius). Further, the high PMA may be due to bulk as opposed to interfacial effects. Magnetic moment 122 may thus be stable perpendicular-to-plane for lateral dimensions (i.e. in-plane dimension(s)) of magnetic structure(s) 100A, 100B and/or 100C that are less than twenty nanometers. In some embodiments, the Al-doped Heusler compound and/or magnetic layer 120/120B are ferrimagnetic. In some embodiments, the Al-doped Heusler compound and/or magnetic layer 120/120B have a reduced magnetic moment for other or additional reasons. For example the nonmagnetic doping, via Al in at least some embodiments, of the Heusler compound. Thus, magnetic layer 120 may have a lower (total) magnetic moment. The high PMA (PMA energy exceeding the out-of-plane demagnetization energy) due at least in part to bulk effects and a low magnetic moment allow magnetic structures 100A, 100B and/or 100C to be used in magnetic junctions that have lateral dimensions less than twenty nanometers, that may be written using STT at lower write currents, and that may be programmed faster (e.g. using current pulses having a shorter duration). Further, magnetic structure(s) 100A, 100B and/or 100C may have enhanced magnetoresistance when used in a magnetic junction. For example, if used in an MTJ, magnetic structures 100A, 100B and/or 100C may have a TMR that is sufficient for use in devices such as STT-MRAM and/or racetrack memories. Consequently, performance and stability of magnetic devices may be improved.

For example, one magnetic material among the family of tetragonal Heusler compounds is the ferrimagnetic $Mn_3Ge$ compound having crystal structure that consists of alternating Mn—Mn and Mn—Ge layers having opposite magnetization. Other examples of such tetragonal Heusler compounds are binary compounds (e.g., $Mn_3Z$, where Z=Ga, Sn, or Sb) and ternary compounds (e.g., $Mn_2CuSb$, $Mn_2CoSn$, $Mn_2OsSn$, etc.). The tunneling magnetoresistance (TMR) of perpendicular-MTJ devices with magnetic layers of $Mn_3Ge$ and CoFeB and with MgO as a tunnel barrier is small even though MgO is known to provide high TMR with conventional magnetic electrodes of CoFeB. These $Mn_3Ge$/MgO/CoFeB MTJ devices were grown on traditional underlayers such as $TaN/IrMn_3$ and $TaN/IrMn_3/TaN$. These traditional underlayers are selected because the traditional underlayers promote growth of $Mn_3Ge$ compound with its tetragonal axis along the layer normal and because the traditional underlayers closely match the in-plane a-axis lattice constant of the $Mn_3Ge$ compound ($a(Mn_3Ge)$=3.73 Å (theoretical prediction) and $a(TaN/IrMn_3$ or $TaN/IrMn_3/TaN$)=~3.76 Å). It is believed that the TMR of $Mn_3Ge$/MgO/CoFeB MTJ devices is small because the TMR is compensated due to the contributions from two competing effects: (i) the bulk layer-dependent spin polarization (SP) of $Mn_3Ge$ (negative for both Mn—Mn and Mn—Ge layers) which promotes a negative TMR, and (ii) the Brillouin zone spin filtering (BZF) effect (arising at the $Mn_3Ge$/MgO interface) that tends to make the TMR positive (for both Mn—Mn and Mn—Ge terminations) with increasing MgO barrier thickness. The coexistence of these two opposing effects limits the use of materials such as $Mn_3Ge$ as a magnetic electrode for p-MTJs formed using an MgO tunnel barrier. It is believed that this limitation has been overcome in magnetic junctions using magnetic structure(s) 100A, 100B and/or 100C. It is believed that the significant reduction in TMR for materials such as $Mn_3Ge$ has been eased by suppressing the contribution from the BZF effect. The BZF effect is closely related to the electronic structure of $Mn_3Ge$. It is believed that the suppression of the BZF effect has been achieved by introducing in-plane strain in the $Mn_3Ge$ compound by growing it on appropriate templating/seed layer: multilayer structure 110. For example, it has been determined that thin $Mn_3Ge$ compound (thickness, t, of up to ~10 nm) deposited on a multilayer structure 110 formed of CoAl is epitaxial with an in-plane lattice constant that of the CoAl layer after 450 in-plane rotation (a(CoAl)=~-4.03 Å). This $Mn_3Ge$ compound has in-plane strain of ~7.5% and using density functional theory (DFT) calculations it has been determined that there is no symmetry spin filtering and no BZF effect for strained $Mn_3Ge$. In such a case, the TMR of the MTJ device is predominantly determined by the spin polarization of the strained $Mn_3Ge$ layer. it is believed that a high TMR is achieved via the use of multilayer structure 110 in combination with Al-doped Heusler compounds of magnetic layer 120/120B by enhancing the spin polarization of the Heusler compound. Although the increase in TMR is described in the context of the above physical phenomena, the discussion is considered illustrative only. Thus, nothing prevents the increase in TMR from being due to other and/or additional effects.

Another consideration is the saturation magnetic moment ($M_s$) of the Al doped Heusler compound. During STT switching of an MTJ device in the precessional switching regime for a switching pulse width <~100 ns (less than or approximately equal to one hundred nanoseconds), the switching current is proportional to the $M_s t$ of a Heusler compound layer (t is the layer thickness). Al doping lowers the $M_s$ of the Heusler compound which implies that reduced switching current would be needed during the STT writing step. The Slater-Pauling rule for Heusler compounds indicates that the magnetic moment, m (in $\mu_B$), per 4 atom unit cell varies with the number of the valence electrons, Nv, per 4 atom unit cell, namely, m=Nv−24. Thus, for $Mn_3Z$ based Heusler compound $m=3Mn_v+Z_v-24$ where $Mn_v$ and $Z_v$ are valence electrons on Mn atom and Z atom ($Mn_v$=7, $Z_v$ for Ge=4 and $Z_v$ for Al=3). $Mn_3Ge$ has magnetic moment m=1 and replacement of Ge by Al proportionately reduces m while complete replacement of Ge with Al leads to $Mn_3Al$ having m=0. This reduction in magnetic moment can lead to a substantial reduction in the STT switching current which is highly desirable in STT-MRAM application.

Thus, a magnetic junction such as an MTJ utilizing magnetic structure(s) 100A, 100B and/or 100C may achieve a stable perpendicular free layer magnetic moment for lateral dimension(s) as low as twenty nanometers or less, a sufficiently high TMR, and a reduced switching current. Consequently, performance of such magnetic devices may be improved.

As discussed above, magnetic structure(s) 100A, 100B and/or 100C may be incorporated in magnetic devices, such as magnetic junctions and magnetic memories using the magnetic junctions. Examples of such magnetic junctions are depicted in FIGS. 2 and 3.

Figure 2:
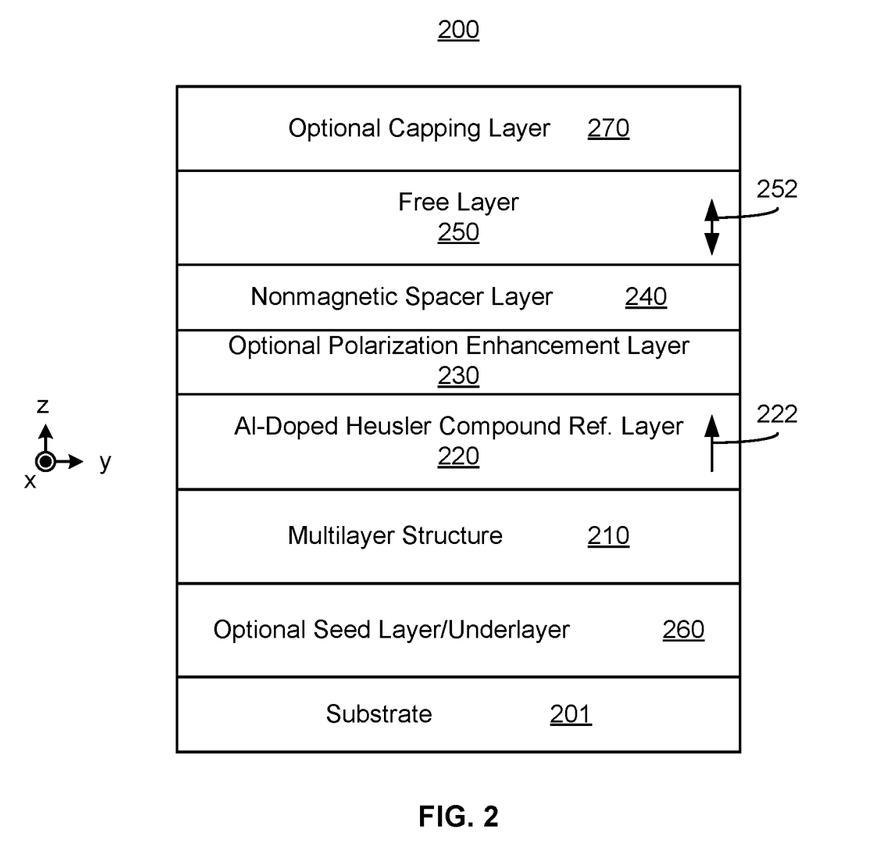
FIG. 2 depicts a magnetic junction including Al-doped Heusler compound(s) and that may be usable in magnetic devices such as magnetic random access memories.
Figure 3:
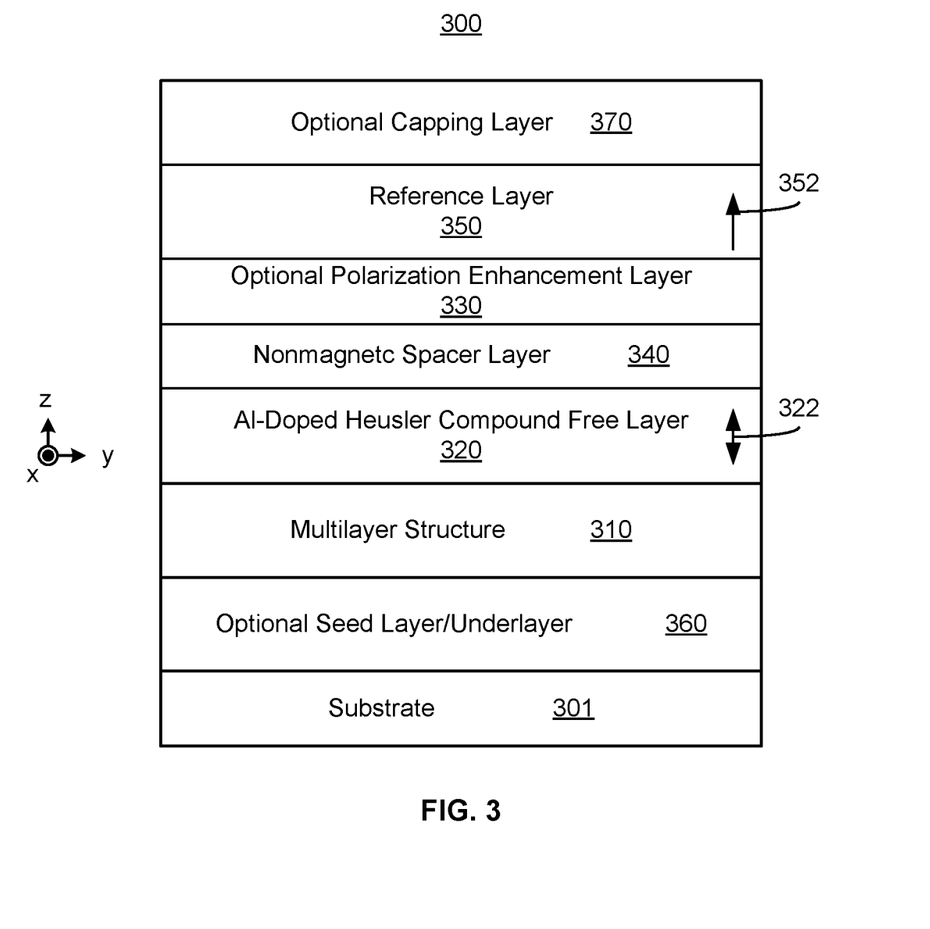
FIG. 3 depicts a magnetic junction including Al-doped Heusler compound(s) and that may be usable in magnetic devices such as magnetic random access memories.

FIG. 2 depicts an embodiments of magnetic device 200 including Al-doped Heusler compounds and having reduced magnetic damping. For clarity, FIG. 2 is not to scale. In the embodiment shown, magnetic device 200 is a top free layer magnetic junction. Thus, the free layer is further from the substrate than the reference layer in magnetic junction 200. Magnetic device 200 may be used in a variety of electronic devices, such as MRAMs and/or racetrack memories. Although particular layers are shown, other and/or different structures may be included.

Magnetic junction 200 resides on substrate 201 and includes multilayer structure 210, reference layer 220, nonmagnetic spacer layer 240 and free layer 250. Reference layer 220 and free (or storage) layer 250 are magnetic, having magnetic moments 222 and 252, respectively. In the embodiment shown, each of reference layer 220 and free layer 250 have a PMA energy that exceeds the out-of-plane demagnetization energy. Consequently, magnetic moments 222 and 252 are shown as perpendicular to plane. Magnetic moment 252 of free layer 250 may be programmed to be in one of multiple stable states. Consequently, magnetic moment 252 is shown as dual headed arrow. Magnetic moment 222 of reference layer 220 is stable in the embodiment shown. Consequently, magnetic moment 222 is shown as a single arrow. Although shown in a particular direction (toward the top of the page), magnetic moment 222 may be stable in another direction (e.g. toward the bottom of the page).

Magnetic junction 200 may include optional polarization enhancement layer(s) (PEL(s)) having a high spin polarization, such as PEL 230. For example, PEL 230 might include Fe, a CoFe alloy, CoFeB, and/or $Co_2MnSi$. PEL 230 is between reference layer 220 and nonmagnetic spacer layer 240. A PEL (not shown) may also be between nonmagnetic spacer layer 240 and free layer 250. Also shown are optional seed layer(s) 260 and optional capping layer(s) 270. Capping layer 270 may include Mo, W, Ta, Pt, Ru, or a combination thereof. Seed layer 260 includes seed layer(s) used for providing multilayer structure 210. For example, seed layer 260 may include a $Mn_xN$ and/or $V_zN$ (e.g. where 2 or 2.5≤x≤4 or 5 and 0.7≤z≤1.3) used for multilayer structure 210.

Nonmagnetic spacer layer 240 may be a conductive or insulating layer. Based on the differences in alignment between magnetic moments 222 and 252, a magnetoresistance is developed across nonmagnetic spacer layer 240. In some embodiments, nonmagnetic spacer layer 240 is a tunnel barrier. Tunnel barrier 240 may include or consist of MgO (001) in some embodiments. In some embodiments (001)-oriented materials, such as CaO and LiF, may be used for tunnel barrier 240. In some embodiments, the $MgAl_2O_4$ may be used for or in tunnel barrier 240. The $MgAl_2O_4$ may have a lattice spacing tuned by controlling Mg—Al composition, which could result in better lattice matching with the Heusler compounds. Thus, tunnel barrier 240 may be or include $Mg_{1-z}Al_{2+(2/3)z}O_4$, where −0.5<z<0.5 in some embodiments. Free layer 250 may be formed of CoFeB, a Heusler compound, and/or other analogous magnetic material(s).

Reference layer 220 is analogous to magnetic layer 120/120B. Reference layer 220 includes an Al-doped Heusler compound having a high PMA. Reference layer 220 may have the structure(s), the thickness(es), and/or composition(s) described above with respect to magnetic layer 120.

Multilayer structure 210 is analogous to multilayer structure 110. Thus, multilayer structure 210 may have analogous structure(s), composition(s), and/or thickness(es) to those of multilayer structure 110. Multilayer structure 210 is thus a templating structure is used to template the Al-doped Heusler compound of reference layer 220 and may be nonmagnetic at room temperature. Reference layer 220 (e.g. the Al-doped Heusler compound) shares an interface with multilayer structure 210. Thus, the combination of multilayer structure 210 and reference layer 220 is analogous to magnetic structure(s) 100A, 100B, and/or 100C.

In some embodiments, magnetic junction 200 is written using STT. Thus, a write current may be driven perpendicular-to-plane (e.g. along the z-axis) in order to program free layer 250. For a write current driven in the positive z-direction, magnetic moment 252 of free layer 250 is programmed to be stable in one direction (e.g. anti-parallel to magnetic moment 222 of reference layer 220). For a write current driven in the −z-direction, magnetic moment 252 of free layer 250 is programmed to be stable in the opposite direction (e.g. parallel to magnetic moment 222). To read magnetic junction, a read current that does not change the state of free layer magnetic moment 252 may be driven perpendicular-to-plane and the magnetoresistance of magnetic junction 200 measured. In such embodiments, magnetic layers 220 and 250 may also serve as electrodes for magnetic junction 200.

Magnetic junction 200 shares the benefits described with respect to magnetic structure(s) 100A, 100B and/or 100C. In particular, reference layer 220 of magnetic junction 200 has a magnetic moment 222 that may be stable perpendicular-to-plane for lateral dimensions (e.g. in the x-y plane) as low as twenty nanometers or less. Further, magnetic junction 200 may also have a high TMR sufficient for use in magnetic memories and other devices. For example, the TMR may be in excess of fifty to one hundred percent. In some cases, TMR may be up to three hundred percent or more. Thus, performance of magnetic junction 200 and device(s) incorporating magnetic junction 200 may be improved.

FIG. 3 depicts an embodiments of magnetic device 300 including Al-doped Heusler compounds and having reduced magnetic damping. For clarity, FIG. 3 is not to scale. In the embodiment shown, magnetic device 300 is a bottom free layer magnetic junction. Thus, the free layer is closer to the substrate than the reference layer in magnetic junction 300. Magnetic device 300 may be used in a variety of electronic devices, such as MRAMs and/or racetrack memories. Although particular layers are shown, other and/or different structures may be included.

Magnetic junction 300 resides on substrate 301 and includes multilayer structure 310, free layer 320, nonmagnetic spacer layer 340 and reference layer 350. Free layer 320 and reference layer 350 are magnetic, having magnetic moments 322 and 352, respectively. In the embodiment shown, each of free layer 320 and free layer 350 have a PMA energy that exceeds the out-of-plane demagnetization energy. Consequently, magnetic moments 322 and 352 are shown as perpendicular to plane. Magnetic moment 322 of free layer 320 may be programmed to be in one of multiple stable states. Consequently, magnetic moment 322 is shown as dual headed arrow. Magnetic moment 352 of reference layer 350 is stable in the embodiment shown. Consequently, magnetic moment 352 is shown as a single arrow. Although shown in a particular direction (toward the top of the page), magnetic moment 352 may be stable in another direction (e.g. toward the bottom of the page).

Magnetic junction 300 may include optional polarization enhancement layer(s) (PEL(s)) having a high spin polarization, such as PEL 330. For example, PEL 330 might include Fe, a CoFe alloy, CoFeB, and/or $Co_2MnSi$. PEL 330 is between reference layer 350 and nonmagnetic spacer layer 340. A PEL (not shown) may also be between nonmagnetic spacer layer 340 and free layer 320. Also shown are optional seed layer(s) 360 and optional capping layer(s) 370. Capping layer 370 may include Mo, W, Ta, Pt, Ru, or a combination thereof. Seed layer 360 includes seed layer(s) used for providing multilayer structure 310. For example, seed layer 360 may include a $Mn_xN$ and/or $V_zN$ (e.g. where 2 or 2.5≤x≤4 or 5 and 0.7≤z≤1.3) used for multilayer structure 310.

Nonmagnetic spacer layer 340 may be a conductive or insulating layer. Based on the differences in alignment between magnetic moments 322 and 352, a magnetoresistance is developed across nonmagnetic spacer layer 340. In some embodiments, nonmagnetic spacer layer 340 is a tunnel barrier. Tunnel barrier 340 may include or consist of MgO (001) in some embodiments. In some embodiments (001)-oriented materials, such as CaO and LiF, may be used for tunnel barrier 340. In some embodiments, the $MgAl_2O_4$ may be used for or in tunnel barrier 340. The $MgAl_2O_4$ may have a lattice spacing tuned by controlling Mg—Al composition, which could result in better lattice matching with the Heusler compounds. Thus, tunnel barrier 340 may be or include $Mg_{1-z}Al_{2+(2/3)z}O_4$, where $-0.5<z<0.5$ in some embodiments. Reference layer 350 may be formed of CoFeB, a Heusler compound, and/or other analogous magnetic material(s). In some embodiments, reference layer 350 may be a synthetic antiferromagnet (SAF) including multiple magnetic layers interleaved with nonmagnetic layers such that the magnetic layers are antiferromagnetically coupled (e.g. via a Ruderman-Kittel-Kasuya-Yosida (RKKY) interaction). In some embodiments, reference layer 350 may be magnetically coupled to a stabilization structure, such as an antiferromagnetic layer or SAF. In some embodiments, additional layers are interposed between reference layer 350 and the SAF (not shown).

Free layer 320 is analogous to magnetic layer 120/120B. Free layer 320 includes an Al-doped Heusler compound having a high PMA. Free layer 320 may have the structure(s), the thickness(es), and/or composition(s) described above with respect to magnetic layer 120.

Multilayer structure 310 is analogous to multilayer structure 110. Thus, multilayer structure 310 may have analogous structure(s), composition(s), and/or thickness(es) to those of multilayer structure 110. Multilayer structure 310 is thus a templating structure is used to template the Al-doped Heusler compound of free layer 320 and may be nonmagnetic at room temperature. Free layer 320 (e.g. the Al-doped Heusler compound) shares an interface with multilayer structure 310. Thus, the combination of multilayer structure 310 and free layer 320 is analogous to magnetic structure(s) 100A, 100B, and/or 100C.

In some embodiments, magnetic junction 300 is written using STT. Thus, a write current may be driven perpendicular-to-plane (e.g. along the z-axis) in order to program free layer 320. For a write current driven in the positive z-direction, magnetic moment 322 free layer 320 is programmed to be stable in one direction (e.g. parallel to magnetic moment 352 of reference layer 350). For a write current driven in the −z-direction, magnetic moment 322 of free layer 320 is programmed to be stable in the opposite direction (e.g. anti-parallel to magnetic moment 352). To read magnetic junction, a read current that does not change the state of free layer magnetic moment 322 may be driven perpendicular-to-plane and the magnetoresistance of magnetic junction 300 measured. In such embodiments, magnetic layers 320 and 350 may also serve as electrodes for magnetic junction 300.

Magnetic junction 300 shares the benefits described with respect to magnetic structure(s) 100A, 100B and/or 100C. In particular, free layer 320 of magnetic junction 300 has a magnetic moment 322 that may be stable perpendicular-to-plane for lateral dimensions (e.g. in the x-y plane) as low as twenty nanometers or less. Free layer 320 may also have a reduced magnetic moment, allowing free layer 320 to be written using a lower write current and/or a shorter write current pulse. Further, magnetic junction 300 may also have a high TMR sufficient for use in magnetic memories and other devices. For example, the TMR may be in excess of fifty to one hundred percent. In some cases, TMR may be up to three hundred percent or higher. Thus, performance of magnetic junction 300 and device(s) incorporating magnetic junction 300 may be improved.

For example, MTJ stacks analogous to magnetic device 200 and/or 300 may be fabricated. In some embodiments, the MTJ stacks can be deposited in an ultra-high vacuum magnetron sputtering chamber with a base pressure of $\sim 2 \times 10^{-9}$ Torr or better on Si substrates or other appropriate substrates. The Si substrates are typically sequentially cleaned in UV ozone chamber to remove any adsorbed organics, rinsed in a de-ionized water bath to remove water soluble contaminants and particulates, exposed to hot IPA vapors to remove water and finally dried in hot nitrogen furnace at ~60° C. For such embodiments, the MTJ stacks can be as follows: Ta/3 Å CoFeB/$Mn_xN$ or $V_zN$ (for seed layer 260/360)/CoAl (for multilayer structure 210/310)/Al doped $Mn_3Ge$ (for free layer 320)/MgO (for nonmagnetic spacer layer 240/340)/CoFeB/Ta or Ir/Synthetic Anti-Ferromagnet/Ta/Ru. The Ta/3 Å CoFeB bilayer underlayer (not shown in FIGS. 2-3) may be used to provide a consistent amorphous seed layer for the MTJ stack. The optional $Mn_xN$ (where $2 \leq x \leq 5$) or $V_zN$ layer can be deposited by reactive magnetron sputtering from a Mn or V target in a mixture of Ar and $N_2$ gases at a sputter gas pressure of ~3 mTorr. The $Ar:N_2$ ratio is adjusted to achieve the requisite composition in the nitride layer and in the sputtering geometry used here it was ~80:20 for $Mn_xN$ and ~98:2 for $V_zN$. Alternately, $Mn_xN$ or $V_zN$ layer can be deposited by sputtering from a MnN or VN target. Other methods are possible in some embodiments. Thickness of the $Mn_xN$ or $V_zN$ layer can be up to few hundred Angstroms in some embodiments. The CoAl layer is a multi-layered structure that is nonmagnetic at room temperature. Thus, the CoAl layer includes alternating layers of Co and E, wherein E includes at least one other element that includes Al, Ga, Ge, and/or Sn. The composition of the structure can be represented by $Co_{1-x}E_x$, with x being in the range from 0.45 to 0.55. This CoAl multilayer structure is a compound with Co a transition metal and Al a main group element. The CoAl seed layer may have terraces with atomic steps between neighboring terraces which separates a terrace with a surface formed from Co with a terrace formed from Al. Such a case is shown in FIG. 1B. In some embodiments, other Co-containing materials may be used in lieu of Co. Thus, the structure may be considered to include alternating layers of A and E, where E is described above and A includes Co (and in some embodiments consists of Co). Due to the chemical affinity of X (or Y) to Al, and of Z to Co, the Heusler layer ($X_2YZ$) orders on the CoAl templating layer at modest temperatures. In some embodiments, the ordering may occur for temperatures as low as room temperature. Annealing may not significantly improve the magnetic properties of the Heusler compound in some embodiments. The thickness of the CoAl multilayer structure may be up to few hundred Angstroms in some cases. The Al-doped Heusler compound may be deposited by suitable sputtering process and has a thickness of at least a unit cell (~8 Å) to few hundred Å. The Heusler compound may include one or more of $Mn_{3.3-x}Ge$, $Mn_{3.3-x}Sn$, and $Mn_{3.3-y}Sb$, where x is at least 0 and not more than 0.8 for $Mn_{3.3-x}Ge$ and $Mn_{3.3-x}Sn$ and where y is at least 0 and not more than 1.3 in the case of $Mn_{3.3-y}Sb$. Note that CoFeB refers to an alloy of Co, Fe, and B without referring to specific stoichiometry. The thickness of the CoFeB layer is chosen such that its magnetic moment is aligned along the perpendicular to the layer thickness. The synthetic antiferromagnet (SAF) layer can be a Co/Pt multilayer which is magnetically coupled to the underlying CoFeB layer. A thin layer of Ta or Ir (order of few Å) is typically interposed between the CoFeB and the SAF layer. The CoFeB layer may be a reference layer having a magnetic moment stabilized by the SAF layer. A variety of cap layers can be used to prevent oxidation of the layers underneath during the exposure of the entire material stack to ambient environment. In some embodiments, other materials and/or layers not inconsistent with the invention may be utilized.

Such magnetic junctions share the benefits described with respect to magnetic structure(s) 100A, 100B and/or 100C and magnetic junctions 200 and/or 300. In particular, the free layer of the magnetic junction has a magnetic moment that may be stable perpendicular-to-plane for lateral dimensions (e.g. in the x-y plane) as low as twenty nanometers or less. The free layer may also have a reduced magnetic moment, allowing the free layer to be written using a lower write current and/or a shorter write current pulse. Further, the magnetic junction may also have a high TMR sufficient for use in magnetic memories and other devices. Thus, performance of such magnetic junctions and device(s) incorporating the magnetic junctions may be improved.

Figure 4:
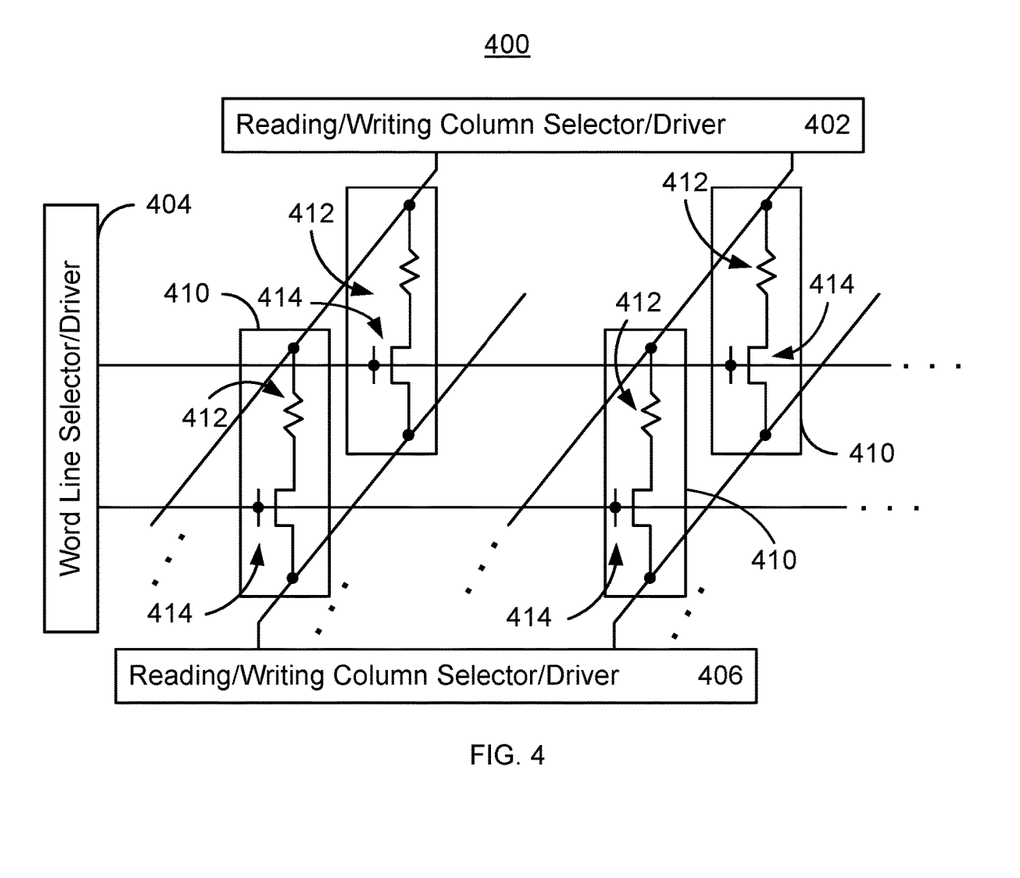
FIG. 4 depicts a magnetic memory including magnetic junctions having Al-doped Heusler compound(s).

FIG. 4 depicts an exemplary embodiment of a memory 400 that may use one or more of magnetic structures 100A, 100B and/or 100C and/or magnetic junctions 200 and/or 300. Magnetic memory 400 includes reading/writing column select drivers 402 and 406 as well as word line select driver 404. Note that other and/or different components may be provided. The storage region of memory 400 includes magnetic storage cells 410. Each magnetic storage cell includes at least one magnetic junction 412 and at least one selection device 414. In some embodiments, the selection device 414 is a transistor. The magnetic junctions 412 may be one of the magnetic junction 200 and/or 300 and/or other analogous magnetic junction(s). Although one magnetic junction 412 is shown per cell 410, in other embodiments, another number of magnetic junctions 412 may be provided per cell. As such, the magnetic memory 400 may enjoy the benefits described above.

Other magnetic devices may incorporate magnetic structure(s) 100A, 100B, and/or 100C. For example, racetrack and/or spin orbit torque magnetic memories may use magnetic structure(s) 100A, 100B and/or 100C. More specifically, magnetic structures 100A, 100B and/or 100C may be used in racetrack memory devices. In some such embodiments, the racetrack is a nanowire that may include a substrate, an optional seed layer, a multilayer structure 110, and a first magnetic layer 120/120B including an Al-doped Heusler compound. Thus, in a racetrack memory device, the tunnel barrier and the additional magnetic layer (250 and 350) shown in FIGS. 2-3 would not normally be present. However, in this case the magnetic layer 220 shown in FIG. 2 would have a magnetic moment that is switchable rather than fixed. Magnetic domain walls may be moved along this racetrack. Data may be read out of (and stored in) the racetrack by interrogating (or changing) the orientation of the magnetic moment of the magnetic material between adjacent domain walls within the racetrack.

Figure 5:
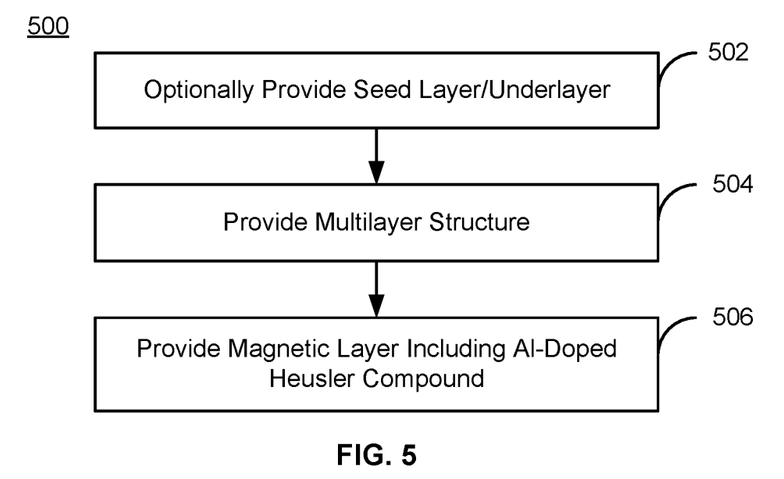
FIG. 5 is a flow-chart depicting a method for fabricating a magnetic device including Al-doped Heusler compound(s) and that may be usable in magnetic devices such as magnetic random access memories.

FIG. 5 is a flow chart depicting an embodiment of method 500 for fabricating magnetic structure. For simplicity, some steps may be omitted, performed in another order, include substeps and/or combined. Although described in the context of single components, multiple components may be fabricated. For example, multiple magnetic structures may be fabricated. Further, the method 500 may start after other steps in forming a magnetic device including the magnetic structure have been performed. For simplicity, the method 500 is described in the context of the magnetic structures 100A, 100B and 100C. However, other magnetic structures may be formed.

A seed layer, such as layer 130 is optionally provided, at 502. In some embodiments, layer 130 is sputtered. A multilayer structure, such as multilayer structure 110, is provided, at 504. In some embodiments, 504 includes depositing or growing one or more layers of the multilayer structure. The layers may be deposited at a particular temperature range. For example, the templating structure may be deposited at a specific temperature or at a specific range of temperature. In some embodiments, the templating structure is provided within a range of temperatures including temperature(s) of not less than 70K and not more than 700K. Deposition methods may include but are not limited to one or more of PVD sputtering, pulsed laser deposition, atomic layer deposition, ion-beam deposition, plasma enhanced chemical vapor deposition and/or other deposition mechanism(s). The fabrication of a layer may include annealing the layer. In-situ annealing (e.g. in vacuum or in any specific gas environment) may be performed right after deposition of any layer shown in each embodiment. Annealing may also occur later in fabrication (e.g. while the surface of the layer is exposed or after deposition of other layer(s)). The range of temperatures for in-situ annealing includes but may not be limited to at least 350K through not more than 700K.

A magnetic layer including one or more Al-doped Heusler compounds, such as magnetic layer 120/120B, is provided, at 506. In some embodiments, 506 may be performed using the same techniques, temperature ranges and processes as described for 504. In some embodiments, the Al-doped Heusler compound(s) provided at 506 may order on the multilayer structure at temperature(s) as low as room temperature or below.

Thus, using method 500, magnetic structures 100A, 100B, and/or 100C may be formed. Thus, the benefits described herein may be achieved. In particular, a high PMA (e.g. stable magnetic moment perpendicular to plane), high TMR and reduced write current may be achieved.

Figure 6:
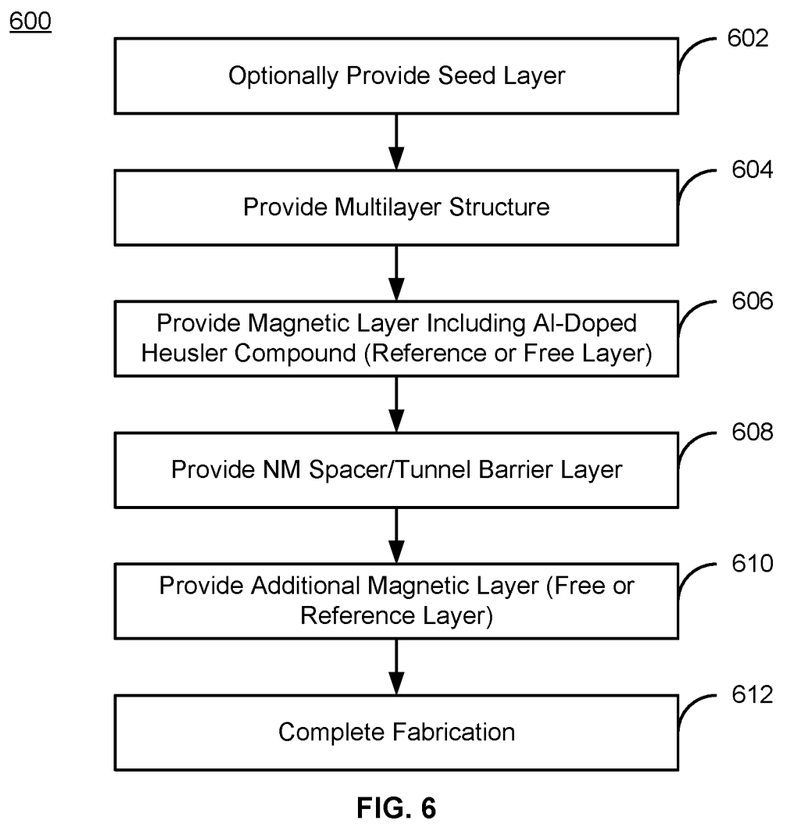
FIG. 6 is a flow-chart depicting a method for fabricating a magnetic junction including Al-doped Heusler compound(s).

FIG. 6 is a flow chart depicting an embodiment of method 600 for fabricating magnetic junction. For simplicity, some steps may be omitted, performed in another order, include substeps and/or combined. Although described in the context of single components, multiple components may be fabricated. For example, multiple magnetic junctions may be fabricated. Further, the method 600 may start after other steps in forming a magnetic device have been performed. For simplicity, the method 600 is described in the context of the magnetic junctions 200 and 300. However, other magnetic junctions may be formed.

A seed layer, such as layer 260 and/or 360 is optionally provided, at 602. In some embodiments, layer 260 and/or 360 is sputtered. In some embodiments, 602 is analogous to 502 of method 500. A multilayer structure, such as multilayer structure 210 and/or 310, is provided, at 604. In some embodiments, 604 is analogous to 504 of method 500. Deposition methods used in 604 may include but are not limited to one or more of PVD sputtering, pulsed laser deposition, atomic layer deposition, ion-beam deposition, plasma enhanced chemical vapor deposition and/or other deposition mechanism(s). The fabrication of a layer may include annealing the layer. In-situ annealing (e.g. in vacuum or in any specific gas environment) may be performed right after deposition of any layer shown in each embodiment. Annealing may also occur later in fabrication (e.g. while the surface of the layer is exposed or after deposition of other layer(s)).

A magnetic layer including one or more Al-doped Heusler compounds is provided, at 606. In some embodiments, 606 may be performed using the same techniques, temperature ranges and processes as described for 604. In some embodiments, therefore, reference layer 220 is fabricated. In other embodiments, free layer 320 is fabricated at 606.

A nonmagnetic spacer layer, such as nonmagnetic spacer layer 240 and/or 340, is provided at 608. In some embodiments, a polarization enhancement layer is provided on the magnetic layer formed at 606 prior to 608. In some embodiments, the nonmagnetic spacer layer provided at 608 is a tunneling barrier. 608 may include one or more of the same fabrication processes, such as sputtering, used in 604.

An additional magnetic layer is provided, at 610. Thus, reference layer 350 or free layer 250 is formed at 610. In some embodiments, multiple layers may be fabricated at 610. For example, a SAF or other magnetic stabilization structure may be provided in addition to the magnetic layer at 610. Fabrication is completed, at 612. For example, in some embodiments, the layers described in steps 602, 604, 606, 608 and 610, as well as any capping layers, are deposited and the layers etched at 612 to define the magnetic junctions. Electrical contacts to various layer(s) in the magnetic junction may also be formed at 612. Bit lines, word lines, and/or other structures may also be formed.

Using method 600, magnetic junctions 200 and/or 300 may be formed. Thus, the benefits described herein may be achieved. In particular, a high PMA (e.g. stable magnetic moment perpendicular to plane), high TMR and reduced write current may be achieved.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A magnetic device, comprising:
   a multilayer structure including alternating layers of A and E, A including a first material, E including at least one other material that includes Al, the first material including at least one of Ru, Ir, or an IrCo alloy, a composition of the multilayer structure being represented by $A_{1-x}E_x$, where x is at least 0.45 and not more than 0.55; and
   a magnetic layer that includes an Al-doped Heusler compound, the magnetic layer sharing an interface with the multilayer structure.

2. The magnetic device of claim 1, wherein the Al-doped Heusler compound is represented by $H_{1-y}Al_yH$, where H is an undoped Heusler compound of the Al-doped Heusler compound, $H_{1-y}$ is the undoped Heusler compound with a species therein reduced by a factor of 1-y, and y is greater than zero and not more than one.

3. The magnetic device of claim 1, wherein a magnetic moment of the magnetic layer is substantially perpendicular to the interface.

4. The magnetic device of claim 3, wherein the magnetic layer has a thickness of not more than 5 nm.

5. The magnetic device of claim 1, wherein the Al-doped Heusler compound includes Al and a Heusler compound, the Heusler compound of the Al-doped Heusler compound is a binary Heusler compound.

6. The magnetic device of claim 5, wherein the Heusler compound includes at least one of $Mn_{3.3-z}Ge$, $Mn_{3.3-z}Sn$, or $Mn_{3.3-y}Sb$, where z is at least 0 and not more than 0.8 and where y is at least 0 and not more than 1.3.

7. The magnetic device of claim 1, wherein the first material includes an IrCo alloy.

8. The magnetic device of claim 1, wherein the at least one other material includes an alloy selected from AlGa, AlSn, AlGe, AlGaGe, AlGaSn, AlGeSn, and AlGaGeSn.

9. The magnetic device of claim 1, further comprising:
   a layer underlying the multilayer structure, the layer including at least one of a $Mn_yN$ layer or a $V_zN$ layer, where y is at least two and not more than five and z is at least 0.7 and not 10 more than 1.3.

10. The device of claim 9, wherein the device is a racetrack memory device.

11. The magnetic device of claim 9, further comprising:
    a tunnel barrier; and
    an additional magnetic layer in contact with the tunnel barrier, the tunnel barrier being between the magnetic layer and the additional magnetic layer.

12. The magnetic device of claim 11, wherein the tunnel barrier is selected from MgO or $Mg_{1-z}Al_{2+(2/3)z}O_4$, wherein $-0.5 \leq z \leq 0.5$.

13. A device, comprising:
    a plurality of magnetic junctions, each of the plurality of magnetic junctions including a multilayer structure, a magnetic layer, an additional magnetic layer, and tunnel barrier between the magnetic layer and the additional magnetic layer, the multilayer structure including alternating layers of A and E, A including a first material, E including at least one other material that includes Al, the first material including at least one of Ru, Ir, or an IrCo alloy, a composition of the multilayer structure being represented by $A_{1-x}E_x$, where x is at least 0.45 and not more than 0.55, the magnetic layer including an Al-doped Heusler compound, the magnetic layer sharing an interface with the multilayer structure, the additional magnetic layer being in contact with the tunnel barrier; and
    a plurality of conductive lines coupled with the plurality of magnetic junctions.

14. The device of claim 13, wherein the Al-doped Heusler compound is represented by $H_{1-y}Al_y$, where H is an undoped Heusler compound of the Al-doped Heusler compound, $H_{1-y}$ is the undoped Heusler compound having a species therein reduced by a factor of 1-y, and y is greater than zero and not more than one.

15. The device of claim 13, wherein a Heusler compound of the Al-doped Heusler compound includes Mn and an element selected from the group consisting of Sn, Sb, or Ge.

16. The device of claim 15, wherein the Heusler compound includes at least one of $Mn_{3.3-z}Ge$, $Mn_{3.3-z}Sn$, or $Mn_{3.3-z}Sb$, where z is at least 0 and not more than 0.8 and where y is at least 0 and not more than 1.3.

17. The device of claim 14, wherein each of the plurality of magnetic junctions further includes:
    a layer underlying the multilayer structure, the layer including at least one of a $Mn_yN$ layer or a $V_zN$ layer, where y is at least two and not more than five and z is at least 0.7 and not more than 1.3.

18. A method, comprising:
    providing a multilayer structure including alternating layers of A and E, A including a first material, E including at least one other material that includes Al, the first material including at least one of Ru, Ir, or an IrCo alloy, a composition of the multilayer structure being represented by $A_{1-x}E_x$, where x is at least 0.45 and not more than 0.55; and
    providing a magnetic layer on the multilayer structure, the magnetic layer including an Al-doped Heusler compound, the magnetic layer sharing an interface with the multilayer structure.

19. The method of claim 18, further comprising:
    providing a layer interposed including at least one of a $Mn_yN$ layer or a $V_zN$ layer, the layer underlying the multilayer structure, where y is at least two and not more than five and z is at least 0.7 and not more than 1.3.

20. The method of claim 18, further comprising:
providing a tunnel barrier; and
providing an additional magnetic layer in contact with the tunnel barrier, the tunnel barrier being between the magnetic layer and the additional magnetic layer.

* * * * *

UNITED STATES PATENT AND TRADEMARK OFFICE
CERTIFICATE OF CORRECTION

PATENT NO. : 11,756,578 B2  
APPLICATION NO. : 17/318998  
DATED : September 12, 2023  
INVENTOR(S) : Jaewoo Jeong et al.

Page 1 of 1

It is certified that error appears in the above-identified patent and that said Letters Patent is hereby corrected as shown below:

In the Claims

In Column 17, Line 40, in Claim 2, delete "$H_{1-y}Al_yH$," and insert -- $H_{1-y}Al_y$, --.

In Column 17, Line 67, in Claim 9, after "not" delete "10".

In Column 18, Line 1, in Claim 10, after "The" insert -- magnetic --.

In Column 18, Line 10, in Claim 12, delete "$-0.5 \leq z \leq 0.5$." and insert -- $-0.5 < z < 0.5$. --.

In Column 18, Line 44, in Claim 17, delete "claim 14," and insert -- claim 13, --.

Signed and Sealed this  
Twelfth Day of December, 2023

Katherine Kelly Vidal  
*Director of the United States Patent and Trademark Office*